(12) United States Patent
Higashi et al.

(10) Patent No.: US 6,586,845 B1
(45) Date of Patent: Jul. 1, 2003

(54) SEMICONDUCTOR DEVICE MODULE AND A PART THEREOF

(75) Inventors: Mitsutoshi Higashi, Nagano (JP); Hiroko Koike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/422,850

(22) Filed: Oct. 25, 1999

(51) Int. Cl.$^7$ .................. H01L 23/34; H01L 23/10; H01L 23/04
(52) U.S. Cl. .............. 257/784; 257/685; 257/712; 257/723; 257/730; 257/704; 257/710; 257/786; 257/686; 257/717
(58) Field of Search ................ 257/712, 717, 257/720, 675, 784, 786, 778, 723, 686, 685, 710, 704, 732

(56) References Cited

U.S. PATENT DOCUMENTS

| | | | |
|---|---|---|---|
| 5,476,211 A | 12/1995 | Khandros | 29/840 |
| 5,572,070 A | 11/1996 | Ross | 257/713 |
| 6,078,500 A * | 6/2000 | Beaman et al. | 257/723 |
| 6,114,763 A * | 9/2000 | Smith | 257/738 |
| 6,236,109 B1 * | 5/2001 | Hsuan et al. | 257/688 |
| 6,309,915 B1 * | 10/2001 | Distefano | 438/127 |

FOREIGN PATENT DOCUMENTS

| | | |
|---|---|---|
| EP | 1-310566 | 12/1989 |
| EP | 0 359 928 | 3/1990 |
| EP | 0 528 606 | 2/1993 |
| JP | 64-77954 | 3/1989 |
| JP | 3-94438 | 4/1991 |
| JP | 8-78584 | 3/1996 |
| JP | 8-306832 | 11/1996 |

\* cited by examiner

*Primary Examiner*—Alexander O. Williams
(74) *Attorney, Agent, or Firm*—Staas & Halsey LLP

(57) ABSTRACT

A semiconductor device module includes one or a plurality of semiconductor devices, each including a semiconductor element having first and second surfaces, pads formed on the first surface on which electrode terminals are also formed and curved, flexible wires having first ends fixed to the pads. The semiconductor devices are mounted on a mounting board such that second ends of the wires are connected to terminals on the mounting board. A heat spreader has a recessed inner wall and a peripheral edge which is adhered to or engaged with the mounting board in such a manner that the second surfaces of the semiconductor elements face a bottom interior surface of the recessed inner wall. A thermal conductive resin layer of a substantially constant thickness is disposed between the second surface of the semiconductor element and the bottom interior surface of the recessed inner wall of the heat spreader.

14 Claims, 6 Drawing Sheets

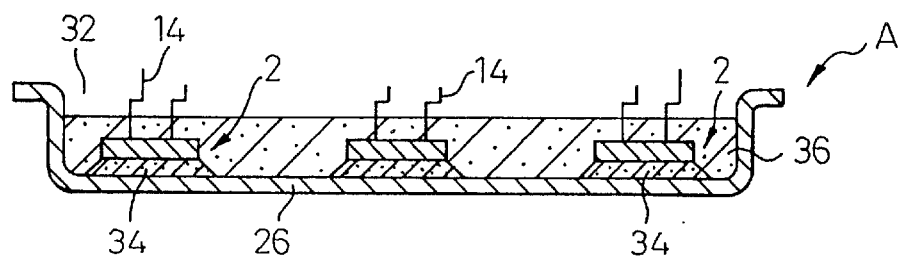
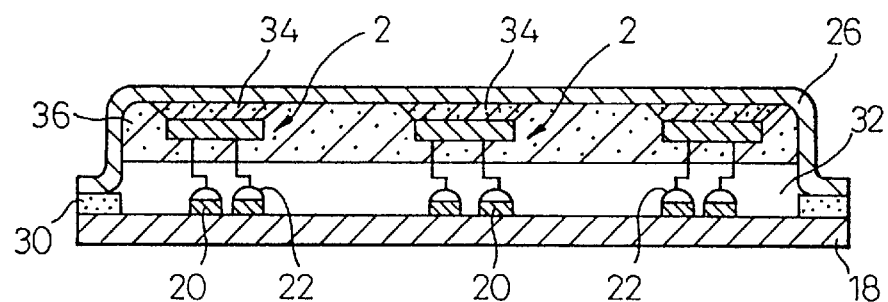
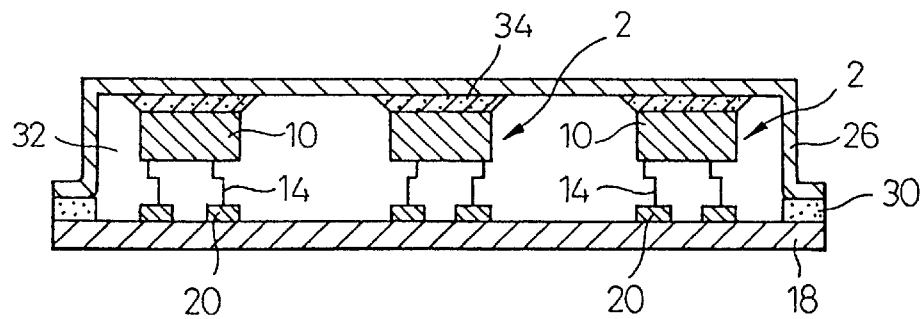

SEMICONDUCTOR DEVICE MODULE AND A PART THEREOF

BACKGROUND OF THE INVENTION

1. Field of the Invention

The present invention relates to a semiconductor device module and a semiconductor device module part and, more particularly, to such a module and a module part, including a plurality of semiconductor devices mounted on a mounting board, each device including a semiconductor element having one surface on which electrode terminals are formed, pads formed on the same surface, and wires provided at an intermediate portion thereof with a bent portion and connected by its one end to a terminal on the mounting board.

2. Description of the Related Art

A chip-sized semiconductor package (CSP), i.e., a semiconductor device which has a substantially same size as that of a semiconductor chip, has been known in the prior art, such as disclosed in U.S. Pat. No. 5,476,211. Such a known CSP is shown in FIG. 12, in which CPS 2 includes a semiconductor chip 10 having one surface, i.e., an electrode forming surface, on which are formed electrode terminals and re-wiring pads 12 to which first ends of respective wires 14 are connected. Each of the wires 14 is flexible, since it has a bent portion at an intermediate position, or portion, thereof. The other, second end 16 of the wire 14 is to be connected to a terminal on a mounting board.

FIG. 13 shows a semiconductor device module in which a plurality of CSPs 2 are mounted on the mounting board 18. The semiconductor device module shown in FIG. 13 includes a plurality of CSPs 2 each of which is connected to a pad 20, as a terminal, on the mounting board 18 via a wire 14. Connection between the wire 14 and the pad 20 is conducted by means of a solder 22.

The bent portion of the wire 14 reduces the thermal stress exerted on both the semiconductor element 10 and the mounting board 18, caused by the difference in thermal expansion coefficient therebetween. In order to allow the wire to be expanded or contracted, a space is kept between an electrode forming surface 10a of the semiconductor element 10, facing the mounting board 18, and the mounting board 18.

On the other hand, since there is a space between the surface 10a of the semiconductor element 10 and the mounting board 18, it is difficult to improve the efficiency of heat radiation from the electrode forming surface 10a of the semiconductor element 10.

Thermal conductivity of the semiconductor device module shown in FIG. 13 can be improved as compared with that of a semiconductor device module having only a space between the bottom of the recessed heat spreader 26 and the other surface 10a of the semiconductor element 10.

However, the length of the wires for connecting the respective pads 20 of the mounting board 18 to the pads 12 of the semiconductor element 10 is variable among the respective CSPs 2, 2, 2, . . . and among the same CSP 2, since the respective wires have respective bent portions. Therefore, the positions of the other surfaces 10b of the semiconductor elements 10 of the CSPs 2 mounted on the mounting board 18 are different for the respective CSPs 2 and, therefore, the thickness of the thermal conductive resin 28 filled on the other surfaces 10b of the semiconductor element 10 is variable so that the level of the thermal conductivity is different for the respective CSPs 2. Thus, a heat accumulated portion may be generated in the semiconductor device module shown in FIG. 13 and may cause error In the CSP 2 shown in FIG. 12, the wires 14 extend upwardly from the pads 12 of the semiconductor elements 10. Therefore, during assembling process of the semiconductor device module, wires 14 of CSP 2 may interfere with the other wires 14 or other parts and may thus be damaged. The wires could be transferred together but handing of the wires would then be troublesome.

SUMMARY OF THE INVENTION

An object of the present invention is to provide a semiconductor device module and a semiconductor device module part, capable of absorbing the thermal stress caused by the difference in respective thermal expansion coefficients of a semiconductor device and a mounting board on which a semiconductor device is mounted, capable of obtaining a uniform heat radiation from the respective semiconductor devices, and affording easy assembling and handling of the semiconductor devices. To overcome the problem of improving efficiency of heat radiation addressed in paragraph 0005 above, the inventors have made an arrangement in which, in order to improve heat radiation from the other surface of the semiconductor element 10, a peripheral edges of recessed portion of a heat spreader 26 is first adhered to a surface of the mounting board 18 by means of an adhesive layer 24 and, then, a bottom of the recessed portion of the heat spreader 26 are arranged to face to the other surfaces of the semiconductor elements 10 which constitute respective CSPs 2, 2, 2, . . . , as shown in FIG. 12. In addition, the inventors filled a thermal conductive resin 28 containing fillers of non-organic material, such as alumina, silica or the others, into a region between the bottom of the recessed heat spreader 26 and the other surface of the semiconductor element 10, to improve the thermal conductivity.

According to the present invention, there is provided an apparatus for a semiconductor device module comprising: a plurality of semiconductor devices, each comprising a semiconductor element having first and second surfaces, pads formed on the first surface on which electrode terminals are also formed and curved, flexible wires having first ends fixed to the pads; a mounting board on which the semiconductor devices are mounted in such a manner that the other, second ends of the wires are connected to terminals on the mounting board; a heat spreader having a recessed inner wall provided with a peripheral edge thereof which is adhered to or engaged with the mounting board in such a manner that the second surfaces of the semiconductor elements faces to a bottom surface of the recessed inner wall; and a thermal conductive resin layer disposed between the second surface of the semiconductor element and the bottom surface of the recessed inner wall of the heat spreader, the thermal conductive resin layer having a substantially constant thickness.

The peripheral edge of the heat spreader is adhered to the mounting board by means of an elastic resin to absorb a difference in thermal expansion due to a difference in thermal expansion coefficient therebetween.

An inside region of the recessed inner wall of the heat spreader is filled with sealing resin in such a manner that the first surface of the semiconductor element is covered with the sealing resin and the wire protrudes from a surface of the sealing resin.

The thermal conductive resin layer is provided for the respective semiconductor element.

The thermal conductive resin layer is a film made of thermal conductive resin.

The thermal conductive resin layer is made of a resin containing therein fillers made of non-organic material, such as alumina, silica or the other, and/or fillers made of metallic material, such as aluminum, copper or the other.

The wire is provided at an intermediate position thereof with a bent portion.

According to another aspect of the present invention, there is provided an apparatus for a semiconductor device module comprising: a plurality of semiconductor devices, each comprising a semiconductor element having first and second surfaces, pads formed on the first surface on which electrode terminals are also formed and curved, flexible wires having one end fixed to the pads; a mounting board on which the semiconductor devices are mounted in such a manner that the other end of the wire is connected to terminals on the mounting board; a heat spreader having a recessed inner wall provided with a peripheral edge thereof which is adhered to or engaged with the mounting board in such a manner that the second surface of the semiconductor element faces to a bottom surface of the recessed wall; and a spring member having one end connected to the bottom surface of the recessed wall of the heat spreader and the other end connected to the second surface of the semiconductor element.

The spring member, having one end connected to the heat spreader and the other end connected to the second surface of the semiconductor element, is made of a part of the recessed wall of the heat spreader which is cut and drawn therefrom.

Each of a plurality of the spring members has one ends connected to the bottom surface of the inner recessed wall of the heat spreader and the other end adhered to the second surface of the semiconductor element.

The second surface of the semiconductor element is adhered to the other end of the spring member by means of an adhesive layer.

According to still another aspect of the present invention, there is provided an apparatus for a semiconductor device module comprising: a least one semiconductor device comprising a semiconductor element having first and second surfaces, pads formed on the first surface on which electrode terminals are also formed and curved, flexible wires having one ends fixed to the pads; a heat spreader having a recessed inner wall provided with a peripheral edge thereof which is to be adhered to or engaged with a mounting board; and a thermal conductive resin layer disposed between the second surface of the semiconductor element and the bottom surface of the recessed inner wall of the heat spreader.

BRIEF DESCRIPTION OF THE DRAWINGS

FIGS. 3(a) and 3(b) show another process for fabricating the semiconductor device module, including a module part, according to the present invention;

FIGS. 4 to 6 are cross-sectional views of other embodiments of a semiconductor device module according to the present invention;

DETAILED DESCRIPTION OF THE EMBODIMENTS

Figure 1:
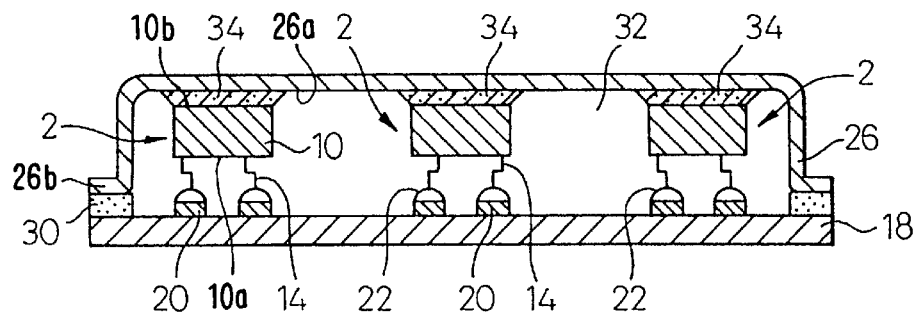
FIG. 1 is a cross-sectional view of an embodiment of a semiconductor device module according to the present invention.
Figure 12:
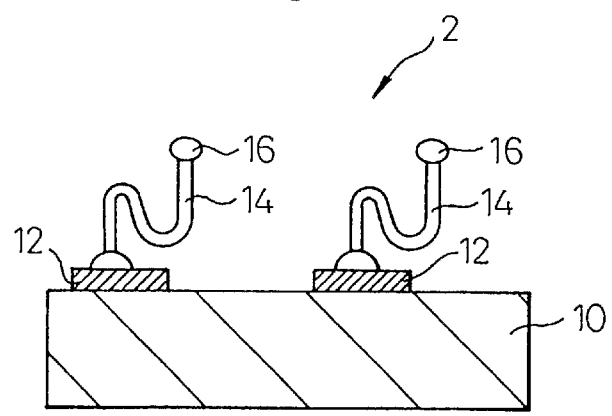
FIG. 12 shows another embodiment of a wire which can be used in this invention.

A semiconductor device module of this invention can be used as a memory module. An embodiment of such a memory module is shown in FIG. 1 which includes a plurality of semiconductor devices, i.e., a plurality of CSP's 2, such as shown in FIG. 12.

The CSP 2, 2, 2, ... are mounted on a mounting board 18 mainly made of resin. That is to say, a semiconductor chip 10 constituting respective CSPs 2 has a first surface 10a, i.e., an electrode forming surface, on which are formed electrode terminals and re-wiring pads 12 to which first ends 14b of wires 14 are connected. Each of the wires 14 is flexible, since it has a bent portion 14a at an intermediate position, or portion, thereof. The other, second end 14c of the wire 14 is connected to a pad 20 on the mounting board 18. A connection between the other, second end of the wire 14 and the pad 20 of the mounting board 18 is provided by solder 22.

A cap-shaped heat spreader 26 made of metal, such as copper, aluminum or other metal, is arranged over second, or opposite, surfaces 10b of the respective CSP's 2, 2, 2, ... mounted on the mounting board 18 (i.e., opposite the electrode forming surface 10a of the semiconductor element 10). The heat spreader 26 has a peripheral edge 26b which is adhered to a surface of the mounting board 18 by means of adhesive layer 30 and defines therewith a recessed inner portion 32. A bottom interior surface 26a of the recessed inner portion 32 faces the respective other surfaces of the semiconductor elements 10.

The adhesive layer 30 is preferably a low elastic resin, the elasticity coefficient of Young's modulus thereof being lower than 100 MPa at room temperature, to make it possible to absorb the difference in the thermal conductivity due to the difference of the thermal expansion coefficient between the heat spreader 26 made of metal and the mounting board 18 mainly made of resin. Such a low elastic resin may be a silicone or fluororesin rubber, polyorephyne elastomer, epoxy resin dispersed with rubber such as NBR, or others.

Thermal conductive resin layers 34, 34, 34, ... made of thermal conductive resin are formed between the bottom interior surface 26a of the heat spreader 26 surrounding the recessed inner portion 32 and the other, second surfaces 10b of the semiconductor elements 10. Thus, heat generated in the semiconductor elements 10 is transmitted through the thermal conductive resin layers 34 to the heat spreader 26 and, therefore, the thermal conductivity can be improved as compared with a semiconductor device module having no such thermal conductive resin layers 34.

The respective thermal conductive resin layers 34, 34, 34, ... have a same (i.e., common) thickness and, therefore, the amount of heat radiated from the respective semiconductor elements to the heat spreader 26 can thus be a uniform value. Thus, any heat accumulated portion would not be formed within the semiconductor device module and thus a heat radiation efficiency can be improved.

The thermal conductive resin which forms the thermal conductive resin layers 34 may be a resin containing fillers of non-organic material, such as alumina, silica or other such materials, and/or metal fillers, such as aluminum, copper or other such metal fillers.

The respective thicknesses of the thermal conductive resin layers 34, 34, 34, . . . may be variable as far as the amount of heat radiated from the respective semiconductor elements 10 to the heat spreader 26 can be a uniform value.

Figure 2A:
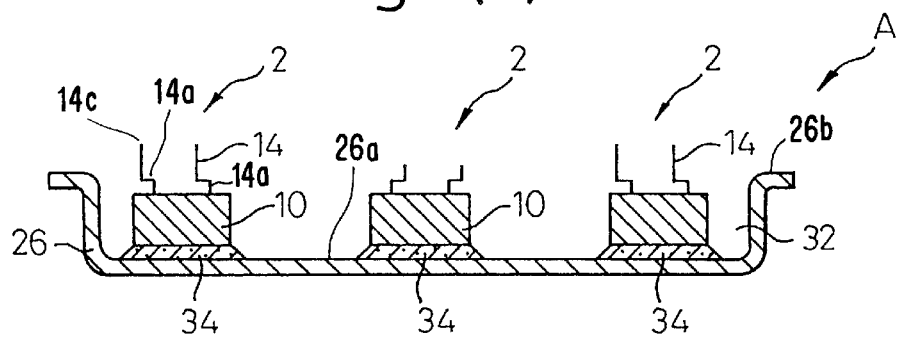
FIGS. 2(a) and 2(b) show a process for fabricating the semiconductor device module shown in FIG. 1.

The semiconductor device module shown in FIG. 1 can be made by using a semiconductor device module part A as shown in FIG. 2(a). The module part A includes the heat spreader 26 having a bottom interior surface 26a to which the other, second surfaces 10b of the semiconductor elements 10 are adhered by means of the thermal conductive resin layers 34.

Figure 2B:
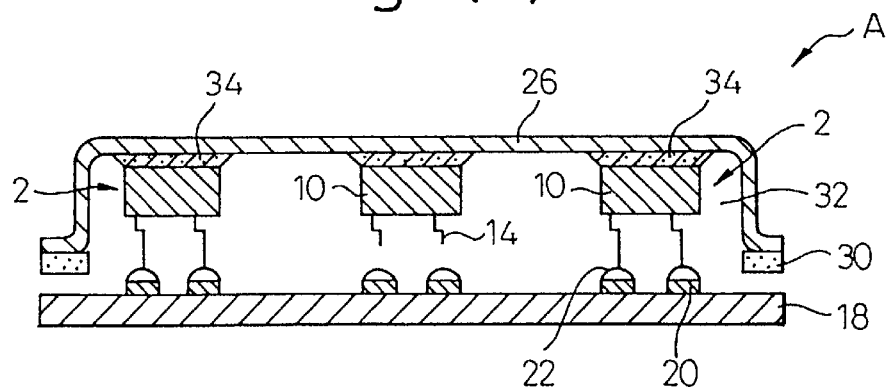

In the module part A, the thermal conductive resin layers 34 for adhering the other surfaces of the semiconductor elements 10 to the bottom of the heat spreader 26 have substantially the same thickness, displacing the surfaces 10b at a uniform spacing from the bottom interior surface 26a and the wires 14 thus extending from the surfaces 10a by respective distances which vary randomly, as seen in FIGS. 2(a) and 2(b). Therefore, in the module part A, the lengths of the respective wires 14 are different with respect to each other. Each wire 14 is provided at an intermediate portion thereof with a bent portion 14a. Therefore, it is very difficult to make the height of the wires 14 uniform.

Since each wire 14 has a bent portion 14a at an intermediate portion thereof, the wire 14 can easily be bent and has an effective resilience. As shown in FIG. 2(b), when the peripheral edge 26a, surrounding the recess 32 of the heat spreader 26, is adhered to the mounting board 18 by means of an adhesive layer 30, the other, free ends 14c of the respective wires 14 can be connected to the pads 20 on the mounting board 18. In other words, a wire 14 which is higher than the other wires can be pushed between, the respective surface 10a of each semiconductor element 10 and the mounting board 18 while the bent portion 14a thereof resiliently deforms to regulate the effective length of that wire, until the other free ends 14c of the wires 14 are brought into contact with the respective pads 20 on the mounting board 18.

In the semiconductor device module part A shown in FIG. 2(a), almost all of the CSPs 2 which are adhered to the bottom interior surface 26a of the spreader 26 are accommodated in the inside of the recess 32. Therefore, when the semiconductor device module part A is transported or stored in its state, the wires 14 may not interfere with wires of the other CSP 2 or the other parts, as compared with a CSP 2 which is transported or stored in its own free state. Therefore, the semiconductor device module can easily be made and the cost of production thereof can be reduced.

In the semiconductor device module part A and the module as shown in FIGS. 1, 2(a) and 2(b), the semiconductor elements 10 are exposed, each thereof together with its electrode forming surfaces 10a. On the other hand, in the semiconductor device module part A and the module as shown in FIGS. 3(a) and 3(b), a sealing resin 36 is filled by a potting or other process within the recess 32 of the heat spreader 26 so as to completely cover the semiconductor elements 10 mounted on the bottom interior surface 26a of the recess 32 of the heat spreader 26 to hermetically seal these semiconductor elements 10.

The bent portions 14a of the wires 14 are protruded from an upper surface of the sealing resin 36. If the bent portions 14a of the wires 14 were sealed in the sealing resin 36, it would become difficult to regulate the height of the respective wires 14 when the semiconductor device module part A is mounted on the mounting board 18 as shown in FIG. 3(b).

In the semiconductor device module as shown in FIGS. 1 to 3(b), the other, free ends 14c of the wires 14 of the CSP 2, 2, 2, . . . are fixed to the pads 20 of the mounting board 18 by means of solder 22. However, solder 22 may not necessarily be used as shown in FIG. 4. The wire 14 has a resilient property due to its bent portion 14a, so that the other, free end 14c of the wire 14 is always pushed toward the pad 20 on the mounting board 18, owing to the resilient property of the wire itself.

Figure 5:
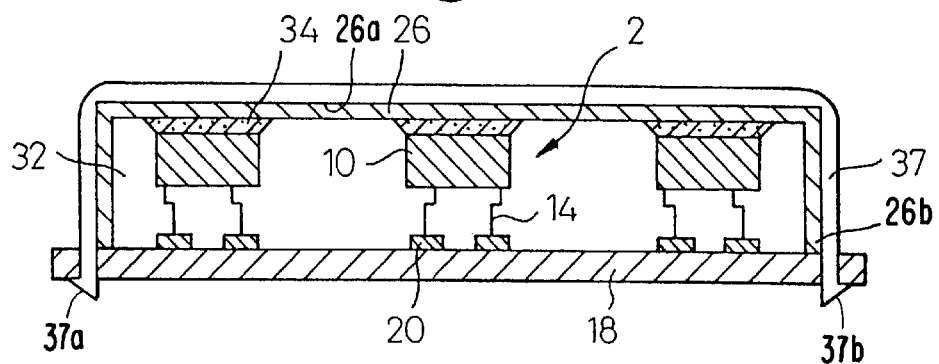

As shown in FIG. 5, the heat spreader 26 can be, pushed toward mounting board 18 by a pushing member 37 which is hooked to the mounting board 18 by its jaws (or hooks) 37a, 37b extending beyond the peripheral edge 26b of the heat spreader 26, so that the peripheral edge 26b of the heat spreader 26 is kept in contact with the surface of the mounting board 18, without any adhesive layer between the peripheral edge 16b of the heat spreader 26 and the mounting board 18. Therefore, the mounting board 18 can easily be separated from the heat spreader 26 and the CSPs 2, 2, 2, . . . by disengaging the hooks 37b of the pushing member 37 from the mounting board 18 and therefore unacceptable CSPs 2 or the other unfavorable parts can easily be changed.

It is also possible that the peripheral sidewalls, surrounding recessed portion 32, of the heat spreader 26 be provided with jaws (or hooks) to be engaged with the mounting board 18 so that the heat spreader 26 can be engaged with the mounting board 18.

Figure 6:
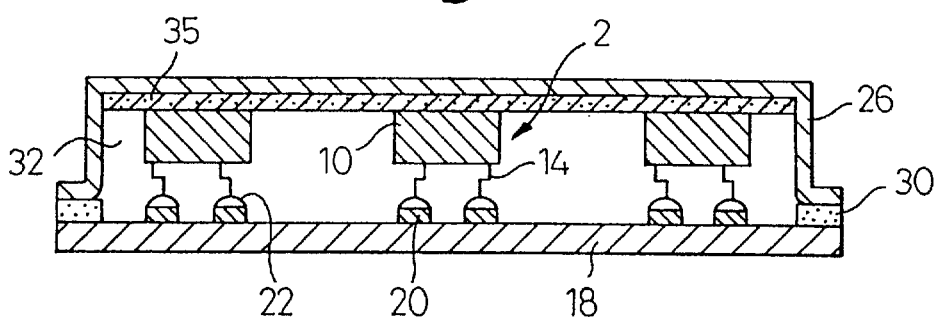
Figure 7:
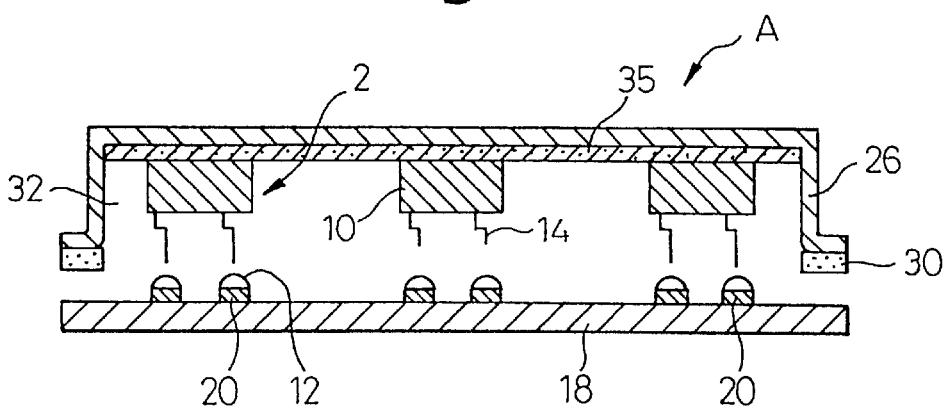
FIGS. 7 and 8 show a process for fabricating the semiconductor device module shown in FIG. 6.

In the embodiments shown in FIGS. 1 to 5, the respective CSPs 2, 2, 2, . . . and the recessed bottom interior surface 26a of the heat spreader 26 are adhered to each other by means of respective thermal conductive resin layers 34 formed for the respective CSPs 2. However, as shown in FIG. 6, a continuous film 35 of thermal conductive resin alternatively can be used to cover the whole area of the recessed bottom interior surface 26a of the heat spreader 26. In such a semiconductor device module part A having the thermal conductive resin layer 35, as shown in FIG. 7, a double-sided adhesive film made of thermal conductive resin such as the thermal conductive resin layer 35, can be used to adhere, by one side thereof, to the recessed bottom interior surface 26a of the heat spreader 26 and by the other side thereof to the respective CSP 2, 2, 2, . . . .

Figure 8:
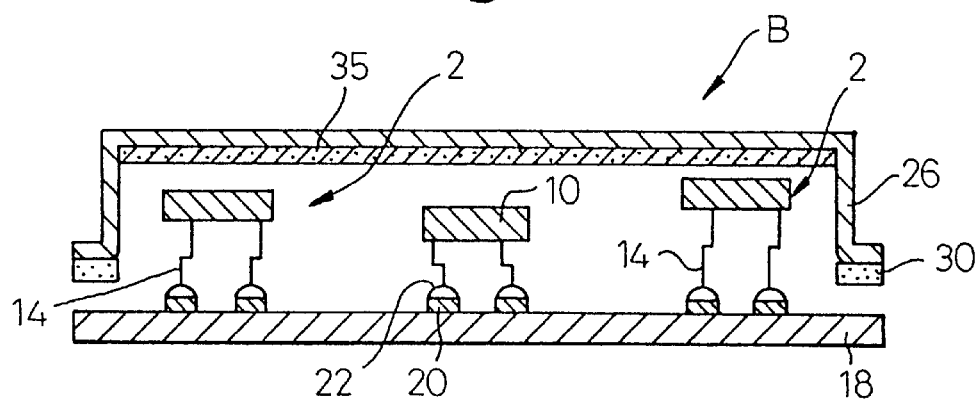

In a semiconductor device module part B shown in FIG. 8, a one-sided adhesive film made of thermal conductive resin can be used to adhere by its adhesive side to the recessed bottom interior surface 26a of the heat spreader 26 to form a thermal conductive resin layer 35. When a semiconductor device module is formed by using the semiconductor device module part B as shown in FIG. 8, the surface of the thermal conductive resin layer 35 facing to the CSP 2 is not adhesive. Therefore, CSP 2, 2, 2, . . . are first mounted on the mounting board 18. Such a mounting is conducted by fixing the other ends 14c of the wires of respective CSP 2, 2, 2, . . . to the respective pads 20 of the mounting board 18 by means of solder 22. Then, the peripheral edge 26b of the heat spreader 26 is adhered to the surface of the mounting surface by means of adhesive layer 30.

The surface of the thermal conductive resin layer 35 adhered to the recessed bottom of the heat spreader 26 pushes the other surfaces 10b of the semiconductor elements 10 constituting the CSPs 2, 2, 2, . . . Due to the pushing by the surface of the thermal conductive resin layer 35, the bent portion of the wire of the CSP 2, the other surface 10b of the semiconductor element 10 being higher than that of the other CSP 2, will be bent largely and the position of the other surface 10b of the semiconductor element 10 becomes gradually lower. Finally, the other surface 10b of the lowermost semiconductor element 10 comes into contact with the surface of the thermal conductive resin layer 35 and thus a semiconductor device module as shown in FIG. 8 can be obtained.

In the semiconductor device module part B shown in FIG. 8, a double-sided adhesive film made of thermal conductive resin can also be used, so that the surface of the thermal conductive resin layer 35 thus formed is adhesive.

Figure 9A:
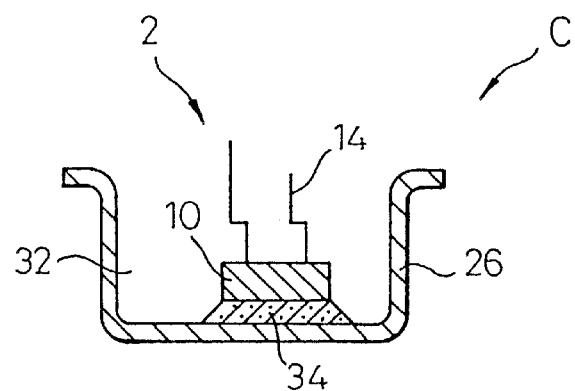
FIGS. 9(a) and 9(b) are cross-sectional views of still another embodiment of a semiconductor device module part and a module using the module part.

In the above-mentioned embodiments, a plurality of CSPs 2 are mounted on the bottom of the recessed portion of the heat spreader 26. However, in a semiconductor device module part C as shown in FIG. 9(a), only one CSP 2 can be mounted on the bottom of the recessed portion of the heat spreader 26 by means of a thermal conductive resin layer 34. In this semiconductor device module part C, almost all of the CSP 2 is accommodated in the inside of the recess 32. Therefore, when the semiconductor device module part C is transported or stored in its state, the wires 14 may not interfere with the wires of the other CSP 2 or the other parts, as compared with a CSP 2 which is transported or stored in its own state. Therefore, the semiconductor device module of the invention can easily be made and the cost of production thereof can be reduced.

Figure 9B:
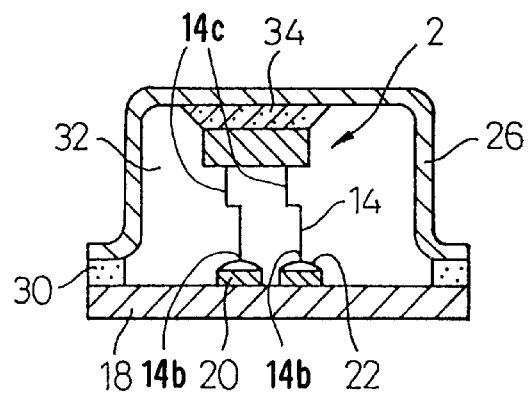

FIG. 9(b) shows a semiconductor device module obtained by using a semiconductor device module part C shown in FIG. 9(a). In this semiconductor device module, the peripheral edge 26b of the heat spreader 26 is adhered to the mounting board 18 by means of adhesive layer 30 and the other end 14c of the lead wire 14 of CSP 2 is fixed to the pad 20 on the mounting board 18 by means of solder 22.

Figure 10:
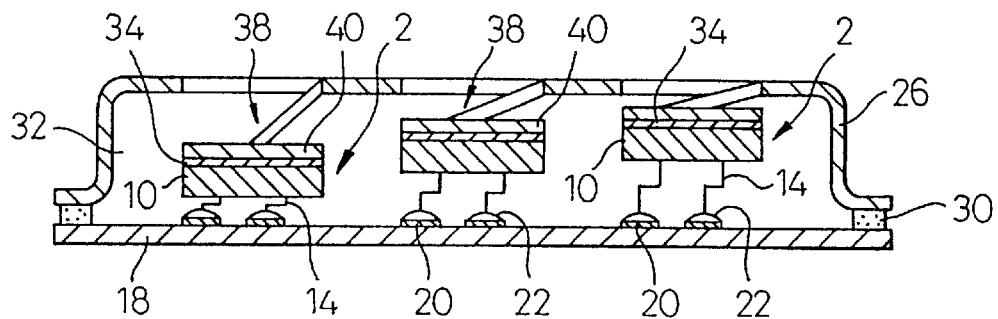
FIG. 10 is a cross-sectional view of still another embodiment of a semiconductor device module of this invention.

FIG. 10 shows another embodiment of a semiconductor device module. In order to improve the heat radiation efficiency and to make uniform the amount of heat radiated, the peripheral edge 26b of the heat spreader 26 is adhered to the surface of the mounting board 18 by means of an adhesive layer 30 and a spring member 38 having a first end connected to and extending integrally from the bottom wall heat spreader 26 surrounding the recess 32 is provided for the respective CSP 2. The second end portion 40 of the spring member 38 is connected to the other surface of the semiconductor element 10 constituting the CSP 2 by means of thermal conductive resin layer 34.

The spring member 38 is formed by cutting and bending a part of the recessed bottom wall of the heat spreader 26 and has a lower resilience than that of the wire 14 of CSP 2 mounted on the mounting board 18.

When the semiconductor device module shown in FIG. 10 is assembled, the other end of the spring member 38 should be adjusted so as to be in contact with the other surface 10b of the semiconductor element 10 which is located at the lowest position among the plurality of CSPs 2, 2, 2, . . . mounted on the mounting board 18. Thus, the heat spreader 26, in which the other ends of the spring members 38 are adjusted, is mounted on the mounting board 18. The difference in height of the semiconductor elements 10 of the respective CSPs 2, 2, 2, . . . can be absorbed by the spring member 38 which is brought into contact with the other surface 10b of the semiconductor element 10 by means of thermal conductive resin layer 34.

Figure 13:
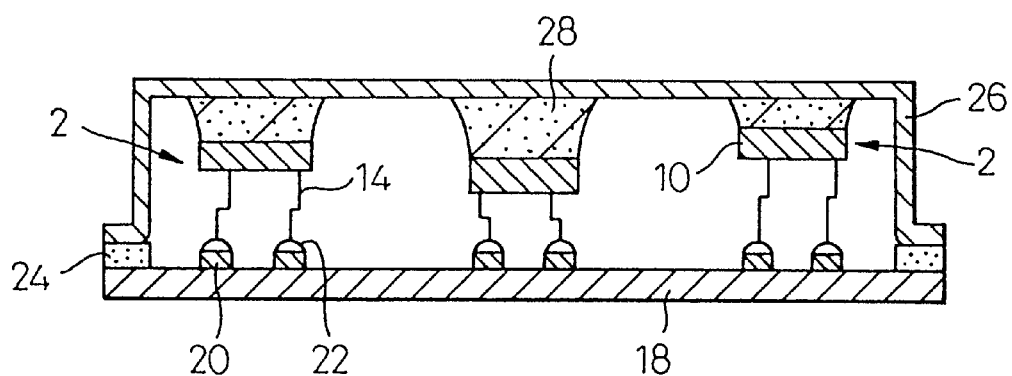
FIG. 13 is a cross-sectional view of a semiconductor device module known in the prior art.

In the semiconductor device module shown in FIG. 10, heat generated in the semiconductor element 10 can be transmitted through the spring member 38 to the heat spreader 26. Since the spring member 38 is made of the same material as that of the heat spreader 26, the thermal conductivity thereof is better than that of the thermal conductive resin 28 used in the semiconductor device module shown in FIG. 13. Thus, in this embodiment, the heat radiation efficiency is improved and the amount of heat radiation is more uniform than those in the semiconductor device module shown in FIG. 13.

Figure 11:
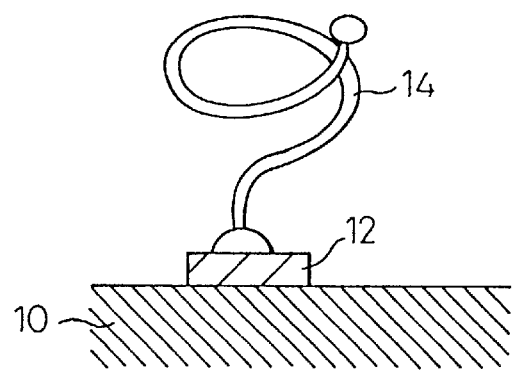
FIG. 11 shows a wire which can be used in this invention.

The wire 14 which can be used in the CSP 2 may be a helical wire such as shown in FIG. 11 in place of a hair pin-shaped wire including two bent portions as shown in FIG. 12.

In CSP 2 such as shown in FIGS. 11 and 12, wiring on the one surface of the semiconductor element 10 is provided with a pad 12 to which one end of the wire 14 is connected. However, the wire 14 can be directly connected to the electrode terminal of the semiconductor.element 10.

It should be understood by those skilled in the art that the foregoing description relates to only some preferred embodiments of the disclosed invention, and that various changes and modifications may be made to the invention without departing from the spirit and scope thereof.

What is claimed is:

1. A semiconductor device module, comprising:
   a plurality of semiconductor devices, each comprising:
      a semiconductor element having first and second surfaces,
      electrode terminals on said first surface,
      pads connected to respective electrode terminals and extending therefrom, insulated from said semiconductor element including said first surface thereof, and
      curved, flexible wires having first ends fixed to said pads and remote second ends;
   a heat spreader having a recessed inner wall and a peripheral edge engaged with said mounting board in such a manner that said second surfaces of the semiconductor elements face a bottom interior surface of the recessed inner wall;
   a thermal conductive resin layer of a substantially constant thickness disposed between each of said second surfaces of the semiconductor elements and said bottom interior surface of the recessed inner wall of the heat spreader and defining a uniform spacing of the respective second surfaces of the semiconductor elements from said bottom interior surface of the recessed inner wall of the heat spreader, the wires extending from the first surfaces of the respective semiconductor elements by distances which may vary randomly;
   a mounting board having plural terminals thereon respectively corresponding to the flexible wires and aligned with the remote second ends of the respective wires; and
   the peripheral edge of the heat spreader being affixed to a corresponding portion of the mounting board and spacing the recessed inner wall thereof at a distance from the mounting board such that wires extending by greater distances flex so as to permit wires extending by shorter distances commonly to engage and be connected to the respective terminals on said mounting board.

2. A semiconductor device module as set forth in claim 1, wherein said peripheral edge of the heat spreader is adhered to said mounting board by means of an elastic resin to absorb a difference in respective thermal expansion due to a difference therebetween in the respective thermal expansion amounts thereof, coefficients thereof.

3. A semiconductor device module as set forth in claim 1, wherein an inside region of the recessed inner wall of the heat spreader is filled with sealing resin in such a manner that said first surface of the semiconductor element is covered with said sealing resin and said flexible wires protrude from an exposed surface of said sealing resin.

4. A semiconductor device module as set forth in claim 1, wherein said thermal conductive resin layer is a film made of a thermal conductive resin.

5. A semiconductor device module as set forth in claim 1, wherein said thermal conductive resin layer is made of a resin containing therein fillers made of non-organic material, such as alumina, silica or other such materials, and/or fillers made of metallic material, such as aluminum, copper or other such materials.

6. A semiconductor device module as set forth in claim 1, wherein each of said wires has a bent portion at an intermediate position thereof.

7. A semiconductor device module part, comprising:
a least one semiconductor device, comprising:
  a semiconductor element having first and second surfaces,
  electrode terminals on said first surface,
  pads connected to respective electrode terminals and extending therefrom, insulated from said semiconductor element including said first surface thereof, and
  curved, flexible wires having first ends fixed to said pads and remote second ends;
a heat spreader having a recessed inner wall and a peripheral edge engaged with a mounting board in such a manner that said second surfaces of the semiconductor elements face a bottom interior surface of the recessed inner wall; and
a thermal conductive resin layer disposed between said second surface of the semiconductor element and a bottom interior surface of the recessed inner wall of the heat spreader and defining a uniform spacing of the respective second surfaces of the semiconductor elements from said bottom interior surface of the recessed inner wall of the heat spreader, the wires extending from the first surfaces of the respective semiconductor elements by distances which may vary randomly;
a mounting board having plural terminals thereon respectively corresponding to the flexible wires and aligned with the remote second ends of the respective wires; and
the peripheral edge of the heat spreader being affixed to a corresponding portion of the mounting board and spacing the recessed inner wall thereof at a distance from the mounting board such that wires extending by greater distances flex so as to permit wires extending by shorter distances commonly to engage and be connected to the respective terminals on said mounting board.

8. A semiconductor device module part as set forth in claim 7, further comprising a plurality of said semiconductor devices each comprising respective semiconductor elements, the second surface of each said semiconductor element being adhered to a bottom interior surface of said recessed inner wall of the heat spreader.

9. A semiconductor device module part as set forth in claim 7, wherein said second surface of the semiconductor element is adhered to said bottom interior surface of said recessed inner wall of the heat spreader by said thermal conductive adhesive layer.

10. A semiconductor device module part as set forth in claim 8, wherein an individual thermal conductive adhesive layer is provided for each respective semiconductor element.

11. A semiconductor device module part as set forth in claim 8, wherein an interior region of the recessed inner wall of the heat spreader is filled with a sealing resin in such a manner that said first surface of each semiconductor element is covered with said sealing resin and said curved, flexible wires protrude from an exposed surface of said sealing resin.

12. A semiconductor device module part as set forth in claim 7, wherein said thermal conductive resin layer is a film made of thermal conductive resin.

13. A semiconductor device module part as set forth in claim 7, wherein said thermal conductive resin layer is made of a resin containing therein fillers made of nonorganic material, such as alumina, silica or other such materials, and/or fillers made of metallic material, such as aluminum, copper or other such materials.

14. A semiconductor device module part as set forth in claim 7, wherein each of said wires has a bent portion at an intermediate position thereof.

* * * * *

UNITED STATES PATENT AND TRADEMARK OFFICE
CERTIFICATE OF CORRECTION

PATENT NO.    : 6,586,845 B1
DATED         : July 1, 2003
INVENTOR(S)   : Mitsutoshi Higashi et al.

It is certified that error appears in the above-identified patent and that said Letters Patent is hereby corrected as shown below:

<u>Title page,</u>
Item [54], Title, change the title to -- SEMICONDUCTOR DEVICE MODULE HAVING HEAT SPREADER ENGAGING A MOUNTING BOARD --
Item [30], insert the missing Foreign Priority Data
-- Japanese    10-307352    October 28, 1998 --.

Signed and Sealed this

Twentieth Day of January, 2004

JON W. DUDAS
*Acting Director of the United States Patent and Trademark Office*